United States Patent [19]

(12) United States Patent
Gorti et al.

(10) Patent No.: US 8,694,842 B2
(45) Date of Patent: Apr. 8, 2014

(54) CONFIGURABLE MUX-D SCAN FLIP-FLOP DESIGN

(75) Inventors: Atchyuth K. Gorti, Austin, TX (US);
Anirudh Kadiyala, Austin, TX (US);
Aditya Jagirdar, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 498 days.

(21) Appl. No.: 12/948,609

(22) Filed: Nov. 17, 2010

(65) Prior Publication Data
US 2012/0124434 A1 May 17, 2012

(51) Int. Cl.
*G06F 11/00* (2006.01)

(52) U.S. Cl.
USPC .......................................... 714/726; 714/733

(58) Field of Classification Search
USPC .......... 714/726, 727, 729, 733, 734, 738, 739
See application file for complete search history.

(56) References Cited

U.S. PATENT DOCUMENTS 6,954,886 B2 * 10/2005 Tu et al. ........................ 714/726
2011/0307750 A1 * 12/2011 Narayanan et al. ........... 714/729

* cited by examiner

*Primary Examiner* — Dieu-Minh Le
(74) *Attorney, Agent, or Firm* — Williams Morgan, P.C.

(57) ABSTRACT

A method, computer program storage device and apparatus are provided for flexible observability during a scan. In one aspect of the present invention, a method is provided. The method includes providing a selector load input to at least a portion of a scan chain, selecting an observe-only scan mode for the at least a portion of the scan chain based at least upon the selector load input, and providing a data input to a storage element in the scan chain based at least upon the observe-only scan mode. The apparatus includes a first scan chain multiplexor comprising a selector input, a first input terminal, a second input terminal and an output terminal. The apparatus also includes a first scan chain storage element comprising an input terminal and an output terminal, where the input terminal of the first scan chain storage element is communicatively coupled to the output terminal of the first scan chain multiplexor. The apparatus further recites that the output terminal of the first scan chain storage element is communicatively coupled to the first input terminal of the first scan chain multiplexor. The computer program storage device adapts a manufacturing facility to create the apparatus.

21 Claims, 5 Drawing Sheets

CONFIGURABLE MUX-D SCAN FLIP-FLOP DESIGN

BACKGROUND

1. Field of the Invention

Embodiments of the present invention relate generally to electrical circuit design and development, and, more particularly, to a method for flexible observability in a scan mode.

2. Description of Related Art

Computer circuitry has evolved from relatively simple, basic implementations to complex, high-speed designs. An increased demand for speed, features and capabilities of modern communications, computing and processing devices has driven computer circuitry to become faster and smaller. Faster and smaller circuit designs have been a challenge for designers who reach the limits of currently known design techniques and strategies. Developments in electrical circuit design have also increased the need for new methods of testing and functionality in scan chains.

During tests of electrical circuits, a scan chain may be used to determine the correctness of circuit functionality during a "scan." Typically, a scan chain consists of a chain of one or more flip-flops through which values are scanned or shifted. The scan chain is typically fully scannable; that is, each flip-flop in the scan chain is controllable and may be observed during the test. In this manner, any fault or signal value on any flip-flop can be seen and used by a tester to control a cone of logic behind the flip-flop. However, such a configuration does not allow for observation-only/observe-only flip-flops in scan. Some schemes use a shadow flip-flop to hold the input of a non-scannable flip-flop, where the non-scannable flip-flop is not in the scan chain, an inherent drawback. These test and scan variations lack a scannable flip-flop implementation (i.e., a scan chain of scannable flip-flops) where the flip-flop may be in an observe-only mode.

SUMMARY OF EMBODIMENTS OF THE INVENTION

In one embodiment of the present invention, a method is provided. The method includes providing a selector load input to at least a portion of a scan chain, selecting an observe-only scan mode for the at least a portion of the scan chain based at least upon the selector load input, and providing a data input to a storage element in the scan chain based at least upon the observe-only scan mode.

In another embodiment of the present invention, an apparatus is provided. The apparatus includes a first scan chain multiplexor comprising a selector input, a first input terminal, a second input terminal and an output terminal. The apparatus also includes a first scan chain storage element comprising an input terminal and an output terminal, the input terminal of the first scan chain storage element being communicatively coupled to the output terminal of the first scan chain multiplexor. The apparatus further recites that the output terminal of the first scan chain storage element is communicatively coupled to the first input terminal of the first scan chain multiplexor.

In yet embodiment aspect of the present invention, a non-transitive, computer readable storage device encoded with data that, when implemented in a manufacturing facility, adapts the manufacturing facility to create an apparatus. The apparatus includes a first scan chain multiplexor comprising a selector input, a first input terminal, a second input terminal and an output terminal, and a first scan chain storage element comprising an input terminal and an output terminal, the input terminal of the first scan chain storage element being communicatively coupled to the output terminal of the first scan chain multiplexor. The apparatus further recites that the output terminal of the first scan chain storage element is communicatively coupled to the first input terminal of the first scan chain multiplexor.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but may nevertheless be a routine undertaking for those of ordinary skill in the art having the benefit of this disclosure.

The present invention will now be described with reference to the attached figures. Various structures, connections, systems and devices are schematically depicted in the drawings for purposes of explanation only and so as to not obscure the disclosed subject matter with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The use of any size complementary metal-oxide semiconductor (CMOS) implementation and technology is contemplated for carrying out various embodiments described herein. Additionally, non-CMOS implementations are also contemplated.

The term "storage element," as used herein, means a flip-flop, a latch, a register, a bitcell or the like, as would be understood by one of ordinary skill in the art having the benefit of this disclosure. Storage elements may be comprised of one ore more storage element components such as metal oxide semiconductor field effect transistors (MOSFETs), other transistors, or the like; storage element components may also be combinations of two or more MOSFETs, other transistors, or the like. "Storage elements" may also encompass groups or arrays of the above mentioned examples. The term "electronic device" may include storage elements specifically in addition to desktop and laptop computers, servers and computing devices, electronic components (e.g., storage drives/hard drives, memory, field programmable gate arrays (FPGAs), application specific integrated circuits (ASICs), programmable logic arrays and programmable array logics (PLAs/PALs), complex programmable logic devices (CPLDs), microprocessors, microcontrollers, floppy drives, tape drives, compact disc and digital video disc (CD-ROM and DVD) drives, and the like, computer monitor devices, printers and scanners, processing devices, wireless devices, personal digital assistants (PDAs), mobile phones, portable music players, video games and video game consoles, external memory devices (e.g., Universal Serial Bus (USB) thumb drives, external hard drives, and the like), audio and video players, stereos, televisions, manufacturing equipment, automobiles and motorcycles, electrical systems in mass-transit vehicles (e.g., buses, trains, airplanes, and the like), security systems and any other device or system employing storage elements. Additionally, an "electronic device" may be an apparatus or device employing elements of a "storage element," as discussed above. An "electronic device" may include one or more "storage elements," one or more arrays of "storage elements," and/or one or more silicon chips. Storage elements, such as flip-flops, may be configured to form a part of a scan chain that may be used for device testing and behavior analysis.

The term "mux" as applied herein means a multiplexor as is known in the industry. The term "standard, prior art Mux-D flip-flop scan chain" refers to a scan chain, as commonly used in the industry, not having the added benefits and features described in the various embodiments of the present invention such as an observe-only scan mode. Such standard, prior art Mux-D flip-flop scan chains use standard Mux-D elements (such as Mux-D element 410, described below with respect to FIG. 4). Standard Mux-D elements, as noted in the Background section above, lack the ability to achieve an observe-only scan mode. As used herein, a scan chain may consist of one or more selectively observable scan element(s) (such as scan element 510 described below with respect to FIG. 5) instead of, or in addition to, one or more standard Mux-D elements.

It is contemplated that different embodiments described herein may be implemented together in various combinations, as would be apparent to one of skill in the art having the benefit of this disclosure. That is, embodiments depicted herein are not mutually exclusive of each other and may be practiced alone, or in any combination, in accordance with the descriptions herein. Embodiments of the present invention generally provide for flexible options for scan chain implementation.

Figure 1:
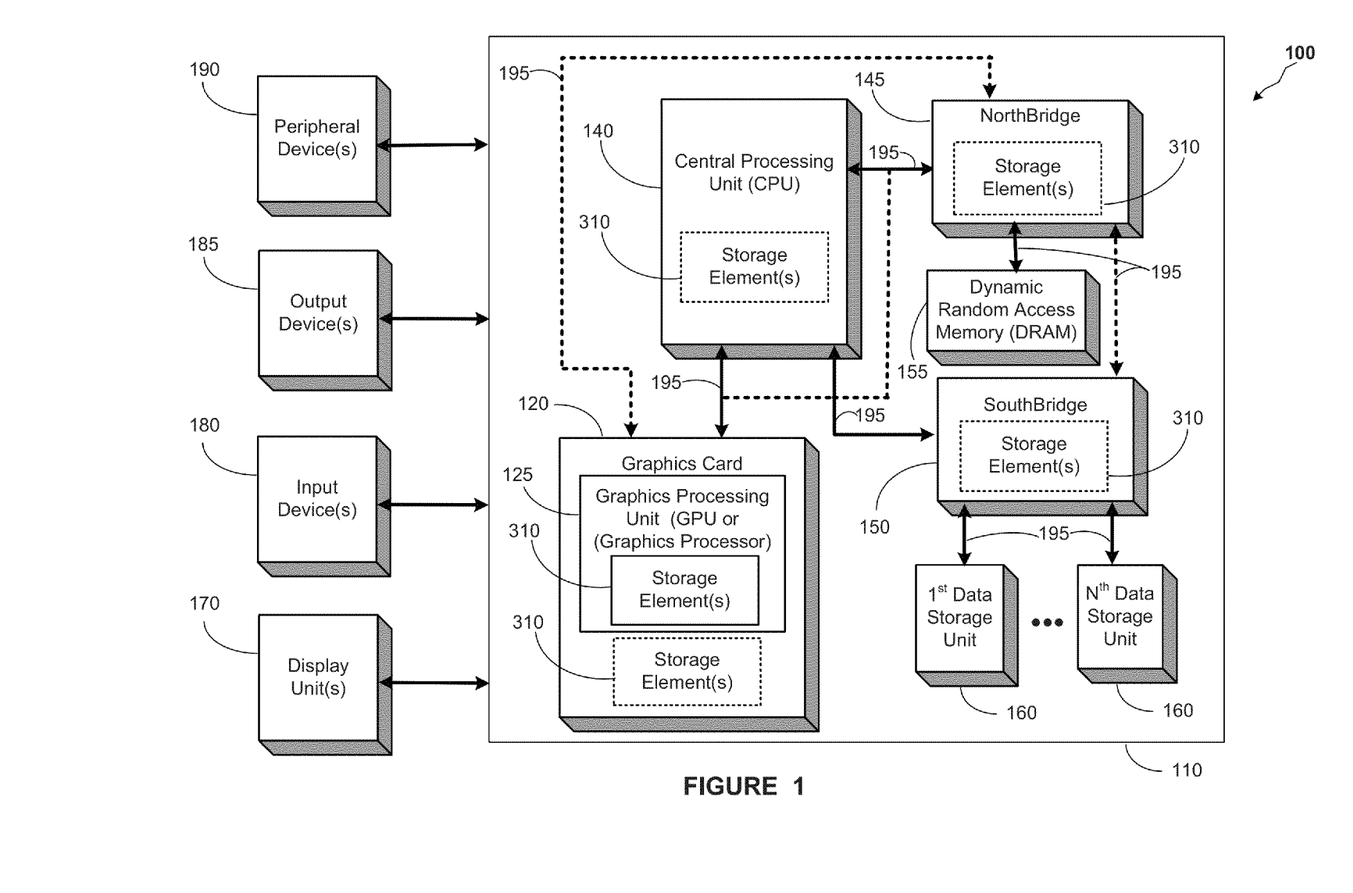
FIG. 1 schematically illustrates a simplified block diagram of a computer system including a graphics card that employs a storage scheme according to one exemplary embodiment.

Turning now to FIG. 1, a block diagram of an exemplary computer system 100, in accordance with an embodiment of the present invention, is illustrated. In various embodiments, the computer system 100 may be a personal computer, a laptop computer, a handheld computer, a mobile device, a telephone, a personal data assistant (PDA), a server, a mainframe, a work terminal, or the like. The computer system 100 includes a main structure 110 which may be a computer motherboard, circuit board or printed circuit board, a desktop computer enclosure and/or tower, a laptop computer base, a server enclosure, part of a mobile device, personal data assistant (PDA), or the like. In one embodiment, the main structure 110 includes a graphics card 120. In one embodiment, the graphics card 120 may be an ATI Radeon™ graphics card from Advanced Micro Devices, Inc. ("AMD") or any other graphics card using memory, in alternate embodiments. The graphics card 120 may, in different embodiments, be connected on a Peripheral Component Interconnect (PCI) Bus (not shown), PCI-Express Bus (not shown) an Accelerated Graphics Port (AGP) Bus (also not shown), or any other connection known in the art. It should be noted that embodiments of the present invention are not limited by the connectivity of the graphics card 120 to the main computer structure 110. In one embodiment, the computer system 100 runs an operating system such as Linux, UNIX, Windows, Mac OS, or the like.

Figure 3A:
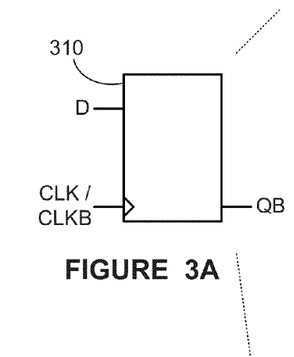
FIGS. 3A-3B illustrate a simplified, exemplary representation of a storage element, and an array of storage elements, which may be used in silicon chips, as well as devices depicted in FIGS. 1 and 2, according to one exemplary embodiment.

In one embodiment, the graphics card 120 may contain a graphics processing unit (GPU) 125 used in processing graphics data. The GPU 125, in one embodiment, may include a storage element 310 (discussed in further detail below with respect to FIG. 3). In one embodiment, the storage element 310 may be an array of storage elements which may be part of an embedded random access memory (RAM), an embedded static random access memory (SRAM), or an embedded dynamic random access memory (DRAM), a CPU 140, GPU 120 or some other integrated circuit (IC). In alternate embodiments, the storage element 310 or array of elements may be embedded in the graphics card 120 in addition to, or instead of, being embedded in the GPU 125. In various embodiments the graphics card 120 may be referred to as a circuit board or a printed circuit board or a daughter card or the like.

In one embodiment, the computer system 100 includes one or more central processing units (CPUs) 140 connected to a northbridge 145. The CPU 140 and northbridge 145 may be housed on the motherboard (not shown) or some other structure of the computer system 100. It is contemplated that in certain embodiments, the graphics card 120 may be coupled to the CPU 140 via the northbridge 145 or some other connection as is known in the art. For example, the CPU 140, the northbridge 145, and the GPU 125 may be included in a single package or as part of a single die or "chips." Alternative embodiments, which alter the arrangement of various components illustrated as forming part of main structure 110, are also contemplated. The CPU 140 and/or the northbridge 145, in certain embodiments, may each include storage elements 310 and/or arrays of storage elements 310 in addition to other storage elements 310 found elsewhere in the computer system 100. In certain embodiments, the northbridge 145 may be coupled to a system RAM (or DRAM) 155; in other embodiments, the system RAM 155 may be coupled directly to the CPU 140. The system RAM 155 may be of any type of RAM known in the art. The type of RAM 155 does not limit the embodiments of the present invention. In one embodiment, the northbridge 145 may be connected to a southbridge 150. In other embodiments, the northbridge 145 and southbridge 150 may be on the same chip in the computer system 100, or the northbridge 145 and southbridge 150 may be on different chips. In one embodiment, the southbridge 150 may have a storage element 310, in addition to any other storage elements 310 elsewhere in the computer system 100. In various embodiments, the southbridge 150 may be connected to one or more data storage units 160. The data storage units 160 may be hard drives, solid state drives, magnetic tape, or any other writable media used for storing data. In various embodiments, the central processing unit 140, northbridge 145, southbridge 150, graphics processing unit 125 and/or DRAM 155 may be a computer chip or a silicon-based computer chip, or may be part of a computer chip or a silicon-based computer chip. In one or more embodiments, the various components of the computer system 100 may be operatively, electrically and/or physically connected or linked with a bus 195 or more than one bus 195.

In different embodiments, the computer system 100 may be connected to one or more display units 170, input devices 180, output devices 185 and/or other peripheral devices 190. It is contemplated that in various embodiments, these elements may be internal or external to the computer system 100, and may be wired or wirelessly connected, without affecting the scope of the embodiments of the present invention. The display units 170 may be internal or external monitors, television screens, handheld device displays, and the like. The input devices 180 may be any one of a keyboard, mouse, track-ball, stylus, mouse pad, mouse button, joystick, scanner or the like. The output devices 185 may be any one of a monitor, printer, plotter, copier or other output device. The peripheral devices 190 may be any other device which can be coupled to a computer: a CD/DVD drive capable of reading and/or writing to physical digital media, a universal serial bus USB device, Zip Drive, external floppy drive, external hard drive, phone and/or broadband modem, router/gateway, access point and/or the like. To the extent certain exemplary aspects of the computer system 100 are not described herein, such exemplary aspects may or may not be included in various embodiments without limiting the spirit and scope of the embodiments of the present invention as would be understood by one of skill in the art.

Figure 2:
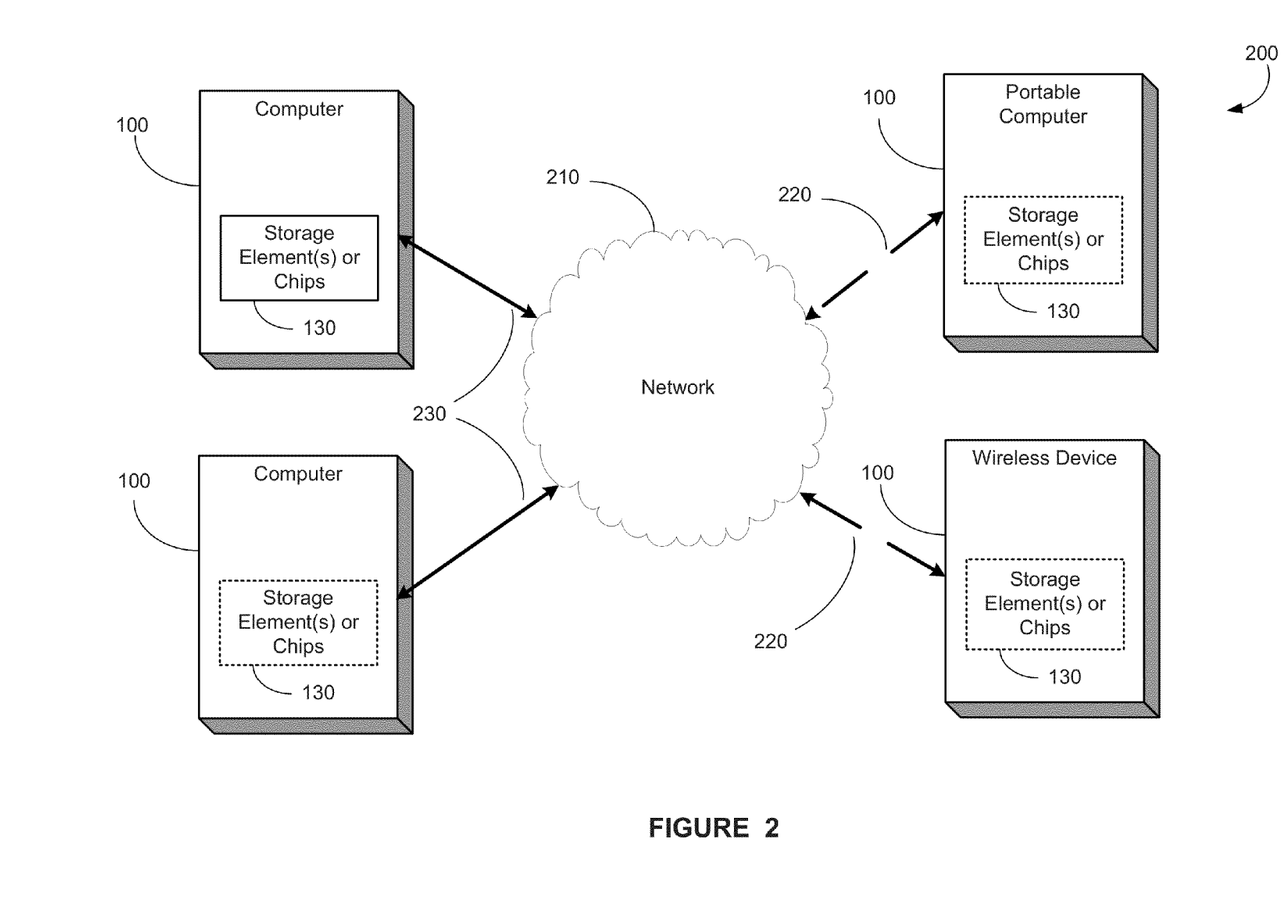
FIG. 2 shows a simplified block diagram of a multiple computer system connected via a network according to one exemplary embodiment.

Turning now to FIG. 2, a block diagram of an exemplary computer network 200, in accordance with an embodiment of the present invention, is illustrated. In one embodiment, any number of computer systems 100 may be communicatively coupled and/or connected to each other through a network infrastructure 210. In various embodiments, such connections may be wired 230 or wireless 220 without limiting the scope of the embodiments described herein. The network 200 may be a local area network (LAN), wide area network (WAN), personal network, company intranet or company network, the Internet, or the like. In one embodiment, the computer systems 100 connected to the network 200 via network infrastructure 210 may be a personal computer, a laptop computer, a handheld computer, a mobile device, a telephone, a personal data assistant (PDA), a server, a mainframe, a work terminal, or the like. The number of computers depicted in FIG. 2 is exemplary in nature; in practice any number of computer systems 100 maybe coupled/connected using the network 200. The computer systems 100 may, in one or more embodiments, comprise one or more scan chains made up of storage elements, in addition to multiplexors (not shown), as further described herein.

Turning now to FIG. 3A, a simplified, exemplary representation of a storage element 310, and array 320 of storage elements 310, which may be used in silicon chips 340, as well as devices depicted in FIGS. 1 and 2, according to one embodiment is illustrated. FIG. 3 depicts an exemplary storage element 310 (here a QB, non-scan, D flip-flop), in accordance with one embodiment. The storage element 310 may be any kind of storage element, including those previously described above. The storage elements 310 may be implemented as single elements (310) or in arrays 320 or in other groups (not shown).

Figure 3B:
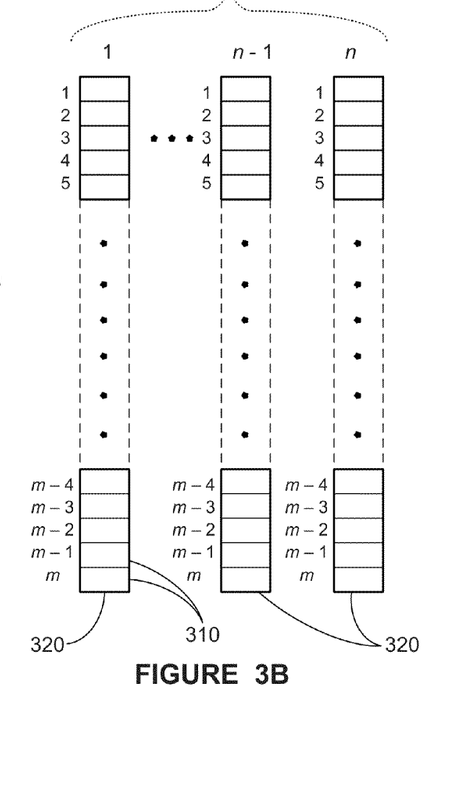

Turning to FIG. 3B, an array 320 of storage elements 310 may be comprised of n columns where each column consists of m rows. In other words, a grouping of storage elements 310 may be implemented in an array 320 of "m×n" storage elements 310. It is contemplated that both m and n may be an integer greater than or equal to 1. For example, according to two specific embodiments, the array 320 may consist of a single storage element 310 (a 1×1 array, where m=1 and n=1) or may consist of 65,536 storage elements 310 (a 256×256 array, where m=256 and n=256) or consist of 256 storage elements 310 (a 256×1 array, where m=256 and n=1), or any other configuration as would be apparent to one of skill in the art having the benefit of this disclosure. The arrays 320 of storage elements 310 may be used in central and graphics processors, motherboards, graphics cards, combinatorial logic implementations, register banks, memory, other integrated circuits (ICs), or the like.

Figure 3C:
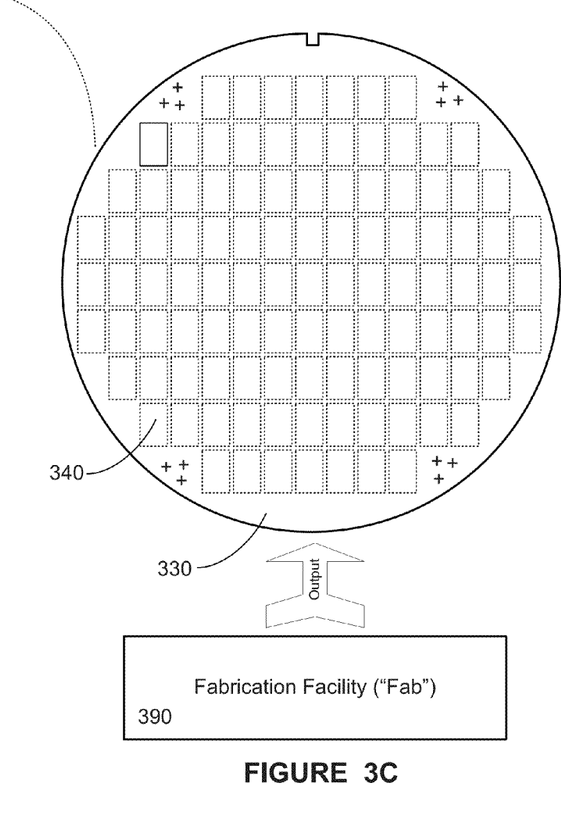
FIG. 3C illustrates a simplified, exemplary representation of a semiconductor fabrication facility used to produce a semiconductor wafer or product, according to one exemplary embodiment.

Turning now to FIG. 3C, in accordance with one embodiment, one or more arrays 320 of storage elements 310 may be included on a silicon chip 340 (or computer chip). A silicon chip 340 may contain one or more different configurations of arrays 320 of storage elements 310. The silicon chips 340 may be produced on a silicon wafer 330 in a fabrication facility (or "fab") 390. That is, the silicon wafers 330 and silicon chips 340 may be referred to as the output, or product of, the fab 390. The silicon chips 340 may be used in electronic devices, such as those described above in this disclosure.

Figure 4:
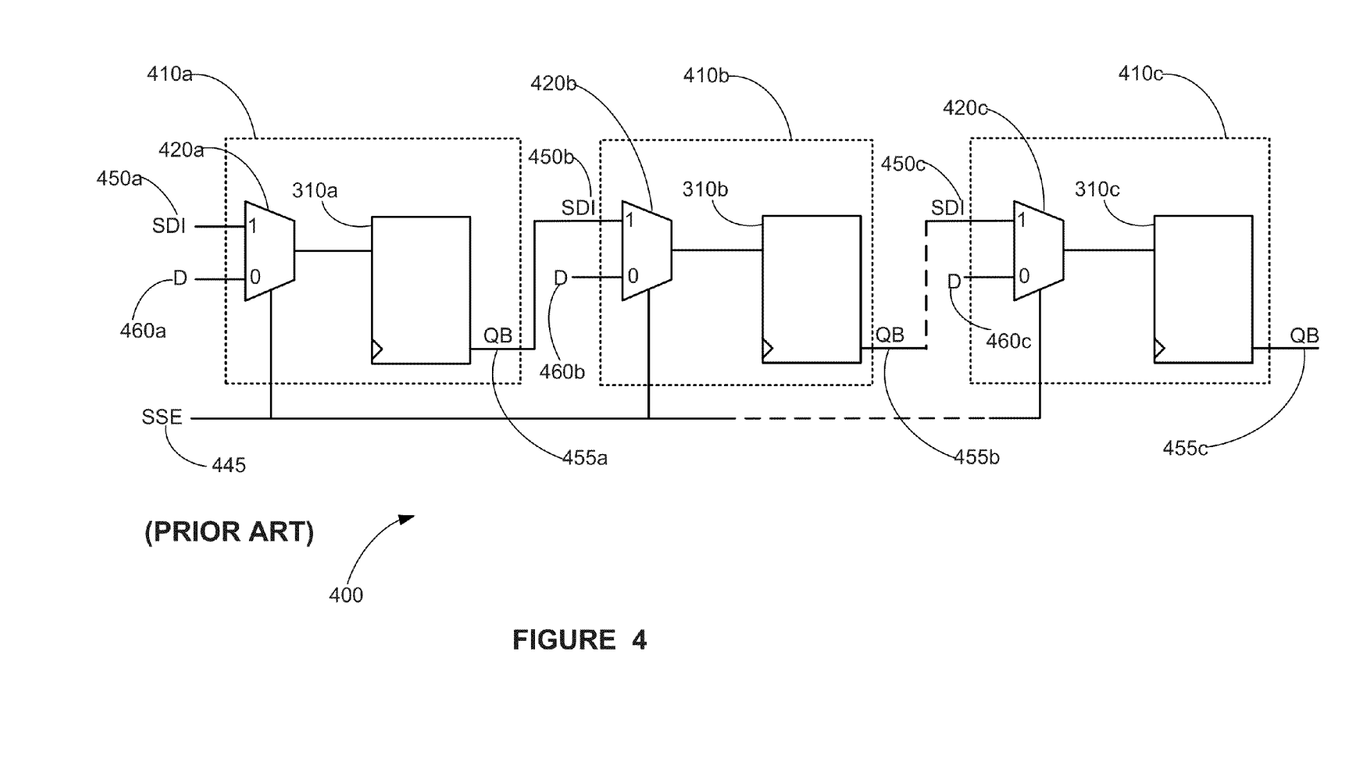
FIG. 4 illustrates detailed, exemplary representation of a standard Mux-D scan chain.

Turning now to FIG. 4, a detailed representation of a standard, prior art Mux-D flip-flop scan chain 400 is depicted. A standard Mux-D scan chain may contain one or more standard Mux-D elements 410(*a-c*). The standard Mux-D element 410(*a-c*) may contain a corresponding multiplexor 420 (*a-c*) (i.e., a mux 420) and a corresponding flip-flop or storage element 310(*a-c*). The corresponding mux 420(*a-c*) may have a scan shift enable 445(*a-c*) (SSE) selector; the corresponding mux 420 may also have a scan data input 450(*a-c*) (SDI) and a data input 460(*a-c*) (D). The output of the mux 420(*a-c*) may be input into the respective storage element 310(*a-c*) (as shown in FIG. 4), and the output of the storage element 310(*a-c*) may be input into the next mux 420(*a-c*) in the Mux-D scan chain 400 on the appropriate SDI 450(*a-c*) input. For example, the output of storage element 310*a* may be input into mux 420*b* on the input line SDI 450*b*. In this way, when the SSE 445 signal is asserted high (i.e., a logical value of '1'), a scan value may be shifted into and through the scan chain 400. In contrast, when the SSE 445 signal is not asserted and is low (i.e., a logical value of '0'), a regular functionality of a storage element 310(*a-c*) may be realized by taking in a data value from an electrical circuit on the data input D 460(*a-c*). Such a configuration, however, does not allow for observation-only/observe-only flip-flops in a scan chain 400.

Figure 5:
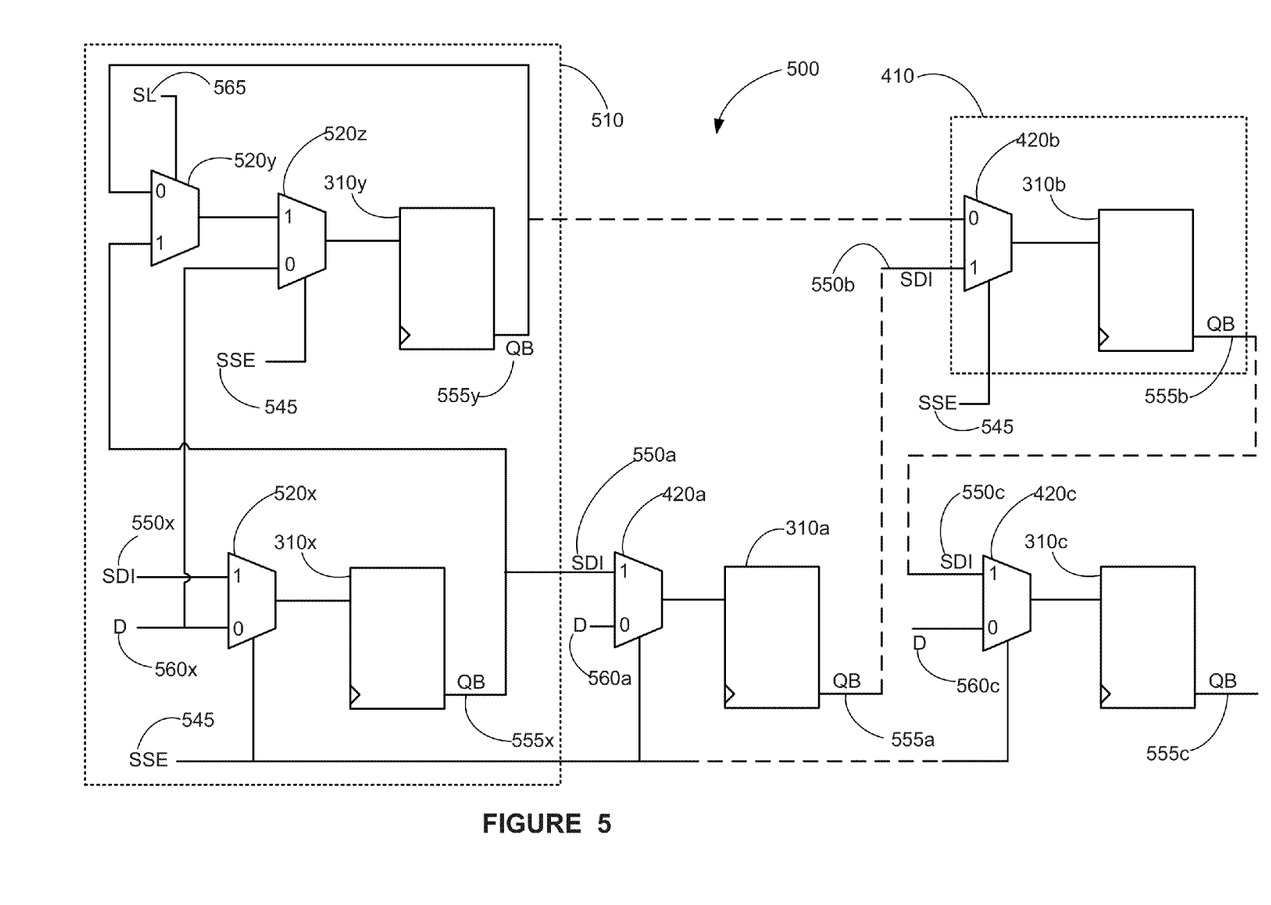
FIG. 5 illustrates a detailed representation of modified scan chain scheme, according to one exemplary embodiment.

Turning now to FIG. 5, a detailed representation of a modified scan chain 500 scheme, in accordance with one or more embodiments, is depicted. As depicted in FIG. 5, the modified scan chain 500 may contain one or more standard, prior art Mux-D elements 410(a-c) as shown in FIG. 4 (discussed above). In one embodiment, the standard Mux-D scan chain 500 may contain one or more Mux-D elements 410(a-c). The Mux-D element(s) 410(a-c) may also contain a corresponding multiplexor 420(a-c) (i.e., a mux 420) and a corresponding flip-flop or storage element 310(a-c). The corresponding mux 420(a-c) may have a scan shift enable 545(a-c) (SSE) selector; the corresponding mux 420 may also have a scan data input 550(a-c) (SDI) and a functional data input signal 560(a-c) (D). The output of the mux 420(a-c) may be input into the respective storage element 310(a-c) (as shown in FIG. 4), and the output of the storage element 310(a-c) may be input into the next mux 420(a-c) in the modified scan chain 500 on the appropriate SDI 550(a-c) input. For example, in one or more embodiments, the output of storage element 310b may be input into mux 420c on the input line SDI 450c.

According to one or more embodiments, the modified scan chain 500 may also contain one or more selectively observable scan elements 510. The selectively observable scan element(s) 510 may include a standard, prior art Mux-D element 410 (comprising a first mux 520x and a first storage element 310x, as shown in FIG. 5) and accompanying connections, as described above in reference to FIG. 4. The selectively observable scan element(s) 510 may also include a second mux 520y, a third mux 520z and a second storage element 310y, as illustratively shown in FIG. 5. The second mux 520y may have as inputs the output QB of the second storage element 310y and the output QB of the first storage element 310x. The second mux 520y may be controlled by a selector load input signal (SL) 565. In one embodiment, an SL 565 value of '0' may allow the second mux 520y to output the QB value 555y of the second storage element 310y, while an SL 565 value of '1' may allow the second mux 520y to output the QB value 555x of the first storage element 310x. In another embodiment, the SL 565 may switch the output values for inputs of '0' and/or '1'. The third mux 520z may have as inputs the output of the second mux 520y and the input D to the first mux 520x. The third mux 520z may be controlled by the scan shift enable signal (SSE) 545. In one embodiment, an SSE 545 value of '1' may allow the third mux 520z to output the output value of the second mux 520x, while an SSE 545 value of '0' may allow the third mux 520z to output the data value D 560x. In another embodiment, the SSE 545 may switch the output values for inputs '0' and/or '1'. The second storage element 310y may have as its input the output of the third mux 520z. The output of the second storage element 310y may be connected to the input of the second mux 520y (as described above) and/or to another element of the modified scan chain 500 such as other selectively observable scan element(s) 510, another standard, prior art Mux-D element 410 and/or other components in the modified scan chain 500 (not shown).

In one or more embodiments, the modified scan chain 500 may be adapted to allow a mode in which storage elements of the modified scan chain 500 are observable and controllable during a scan. In one or more embodiments, the modified scan chain 500 may be adapted to allow a mode in which the selectively observable scan elements 510 of the modified scan chain 500 are observable-only during a scan (i.e., observe-only scan elements 510). An observable-only/observe-only scan mode, in accordance with one or more embodiments, may mean that the storage elements in the scan chain may not have scan values shifted into them; that is, the storage elements in an observable-only/observe-only scan mode may be observed, but otherwise not controlled or altered. In such a mode during which the selectively observable scan elements 510 of the modified scan chain 500 are observable-only/observe-only, the selectively observable scan elements 510 of the modified scan chain 500 may be reset only during a cold reset. In other words, the selectively observable scan elements 510 of the modified scan chain 500 remain persistent (i.e., they do not change value, their values are maintained) while powered on (i.e., during use, during a sleep mode and/or during a reset from a powered-on state). The selectively observable scan elements 510 of the modified scan chain 500 will be reset when powered up from an unpowered state. Subsequent to a cold reset, a reset value (i.e., value the selectively observable scan elements 510 will hold when the selectively observable scan elements 510 is actually reset, typically '1' or '0') may be stored in the selectively observable scan element(s) 510. The modified scan chain 500 described in the embodiments herein may allow for a synthesizable design using industry standard toolsets without the need for additional custom circuitry. Further, the modified scan chain 500 described in the embodiments herein may allow for a control-and-observe scan mode and an observe-only/observe-only mode without the need for an additional shadow storage element.

It is further contemplated that, in some embodiments, different kinds of hardware descriptive languages (HDL) may be used in the process of designing and manufacturing very large scale integration circuits (VLSI circuits) such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate Graphic Database System (GDS) data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., the data storage unit(s) 160, the RAM 155, compact discs, DVDs, solid state storage and the like). In one embodiment, the GDSII data (or other similar data) may be adapted to configure a manufacturing facility (e.g., through the use of mask works) to create devices capable of embodying various aspects of the instant invention. In other words, in various embodiments, this GDSII data (or other similar data) may be programmed into a computer 100, processor 125/140 or controller, which may then control, in whole or part, the operation of a semiconductor manufacturing facility (or fab) 390 to create semiconductor products and devices. For example, in one embodiment, silicon wafers 330 containing various configurations of asymmetrically sized and/or skewed storage elements 310 optimized for leakage reduction may be created using the GDSII data (or other similar data).

It should also be noted that while various embodiments may be described in terms of storage elements optimized for leakage reduction, it is contemplated that the embodiments described herein may have a wide range of applicability, not just for specific implementations described here, as would be apparent to one of skill in the art having the benefit of this disclosure.

The particular embodiments disclosed above are illustrative only, as the invention may be modified and practiced in different but equivalent manners apparent to those skilled in the art having the benefit of the teachings herein. Furthermore, no limitations are intended to the details of construction or design as shown herein, other than as described in the claims below. It is therefore evident that the particular embodiments disclosed above may be altered or modified and all such variations are considered within the scope and spirit of the claimed invention.

Accordingly, the protection sought herein is as set forth in the claims below.

What is claimed:

1. A method comprising:
   providing a selector load input to at least a portion of a scan chain;
   selecting an observe-only scan mode for the at least a portion of the scan chain based at least upon the selector load input; and
   providing a data input to a storage element in the scan chain based at least upon the observe-only scan mode.

2. The method of claim 1, further comprising maintaining a stored data value in the storage element subsequent to a warm reset.

3. The method of claim 1, further comprising storing a reset value in the storage element subsequent to a cold reset.

4. The method of claim 1, further comprising:
   maintaining a stored data value in the storage element subsequent to a warm reset; and
   storing a reset value in the storage element subsequent to a cold reset.

5. The method of claim 1, further comprising:
   providing a scan shift enable input to the at least a portion of the scan chain; and
   selecting the observe-only scan mode for the at least a portion of the scan chain based at least upon the scan shift enable input.

6. The method of claim 1, further comprising providing an output from the storage element to at least one other portion of the scan chain.

7. The method of claim 6, wherein the at least one other portion of the scan chain comprises a control-and-observe storage element.

8. The method of claim 6, wherein the at least one other portion of the scan chain comprises a selectively observable scan element.

9. An apparatus for providing an observe-only scan mode, comprising:
   a first scan chain multiplexor comprising a selector input, a first input terminal, a second input terminal and an output terminal;
   a first scan chain storage element comprising an input terminal and an output terminal, the input terminal of the first scan chain storage element being communicatively coupled to the output terminal of the first scan chain multiplexor; and
   wherein the output terminal of the first scan chain storage element is communicatively coupled to the first input terminal of the first scan chain multiplexor.

10. The apparatus of claim 9, further comprising:
    a second scan chain multiplexor comprising a selector input, a first input terminal, a second input terminal and an output terminal, the second input terminal of the second scan chain multiplexor being communicatively coupled to the output terminal of the first scan chain multiplexor, and the output terminal of the second scan chain multiplexor being communicatively coupled to the input terminal of the first scan chain storage element.

11. The apparatus of claim 10, further comprising:
    a third scan chain multiplexor comprising a selector input, a first input terminal, a second input terminal and an output terminal; and
    a second scan chain storage element comprising an input terminal and an output terminal, the input terminal of the second scan chain storage element being communicatively coupled to the output terminal of the third scan chain multiplexor, and the output terminal of the second scan chain storage element being communicatively coupled to the second input terminal of the first scan chain multiplexor.

12. The apparatus of claim 11, wherein the first input terminal of the third scan chain multiplexor is communicatively coupled to the first input terminal of the second scan chain multiplexor and to a functional data input signal, and wherein the second input terminal of the third scan chain multiplexor is communicatively coupled to a scan chain data input.

13. The apparatus of claim 9, further comprising:
    a plurality of first scan chain multiplexors;
    a plurality of first scan chain storage elements; and
    wherein the plurality of first scan chain multiplexors and the plurality of first scan chain storage elements comprise at least a portion of a scan chain.

14. The apparatus of claim 13, wherein the at least a portion of a scan chain comprises at least a portion of an integrated circuit.

15. A non-transitive, computer readable storage device encoded with data that, when implemented in a manufacturing facility, adapts the manufacturing facility to create an apparatus for providing an observe-only scan mode, comprising:
    a first scan chain multiplexor comprising a selector input, a first input terminal, a second input terminal and an output terminal;
    a first scan chain storage element comprising an input terminal and an output terminal, the input terminal of the first scan chain storage element being communicatively coupled to the output terminal of the first scan chain multiplexor; and
    wherein the output terminal of the first scan chain storage element is communicatively coupled to the first input terminal of the first scan chain multiplexor.

16. A non-transitive, computer readable storage device, as set forth in claim 15, encoded with data that, when implemented in a manufacturing facility, adapts the manufacturing facility to create an apparatus, further comprising:
    a second scan chain multiplexor comprising a selector input, a first input terminal, a second input terminal and an output terminal, the second input terminal of the second scan chain multiplexor being communicatively coupled to the output terminal of the first scan chain multiplexor, and the output terminal of the second scan chain multiplexor being communicatively coupled to the input terminal of the first scan chain storage element.

17. The non-transitive, computer readable storage device, as set forth in claim 16, encoded with data that, when implemented in a manufacturing facility, adapts the manufacturing facility to create an apparatus, further comprising:
    a third scan chain multiplexor comprising a selector input, a first input terminal, a second input terminal and an output terminal; and
    a second scan chain storage element comprising an input terminal and an output terminal, the input terminal of the second scan chain storage element being communicatively coupled to the output terminal of the third scan chain multiplexor, and the output terminal of the second scan chain storage element being communicatively coupled to the second input terminal of the first scan chain multiplexor.

18. The non-transitive, computer readable storage device, as set forth in claim 17, encoded with data that, when implemented in a manufacturing facility, adapts the manufacturing facility to create an apparatus, wherein the first input terminal of the third scan chain multiplexor is communicatively coupled to the first input terminal of the second scan chain multiplexor and to a functional data input signal, and wherein the second input terminal of the third scan chain multiplexor is communicatively coupled to a scan chain data input.

19. The non-transitive, computer readable storage device, as set forth in claim 18, encoded with data that, when implemented in a manufacturing facility, adapts the manufacturing facility to create an apparatus, wherein the apparatus comprises a portion of a semiconductor workpiece.

20. The non-transitive, computer readable storage device, as set forth in claim 15, encoded with data that, when implemented in a manufacturing facility, adapts the manufacturing facility to create an apparatus, further comprising:
   a plurality of first scan chain multiplexors;
   a plurality of first scan chain storage elements; and
   wherein the plurality of first scan chain multiplexors and the plurality of first scan chain storage elements comprise at least a portion of a scan chain.

21. The non-transitive, computer readable storage device, as set forth in claim 20, encoded with data that, when implemented in a manufacturing facility, adapts the manufacturing facility to create an apparatus, wherein the at least a portion of a scan chain comprises at least a portion of an integrated circuit.

* * * * *